United States Patent [19]
Sanjurjo et al.

[11] Patent Number: 5,171,734
[45] Date of Patent: Dec. 15, 1992

[54] METHOD OF COATING A SUBSTRATE

[75] Inventors: Angel Sanjurjo, San Jose; Bernard J. Wood, Santa Clara, both of Calif.

[73] Assignee: SRI International, Menlo Park, Calif.

[21] Appl. No.: 688,149

[22] Filed: Apr. 22, 1991

[51] Int. Cl.$^5$ .................. H01B 12/00; H01L 39/12; B05D 1/24; C23C 16/00
[52] U.S. Cl. ......................... 505/1; 427/185; 427/255.2; 427/255.3; 118/716; 118/DIG. 5
[58] Field of Search .................. 427/185, 255.2, 255.3; 118/DIG. 5, 716; 505/1, 734

[56] References Cited

U.S. PATENT DOCUMENTS

| | | | |
|---|---|---|---|
| 2,830,888 | 4/1958 | Wade | 75/1 |
| 3,233,966 | 2/1966 | Cooper | 23/87 |
| 3,304,249 | 2/1967 | Katz | 204/164 |
| 3,488,143 | 1/1970 | Wendell et al. | 23/87 |
| 3,959,446 | 5/1976 | Mazdiyasni et al. | 423/344 |
| 3,979,500 | 9/1976 | Sheppard et al. | 423/289 |
| 4,204,028 | 5/1980 | Donley | 427/432 |
| 4,399,115 | 8/1983 | Sato et al. | 423/344 |
| 4,416,863 | 11/1983 | Sato et al. | 423/344 |
| 4,452,767 | 6/1984 | Brynestad et al. | 423/297 |
| 4,503,021 | 3/1985 | Brynestad et al. | 423/297 |
| 4,569,862 | 2/1986 | Arai et al. | 427/255 |
| 4,572,902 | 2/1986 | Matano et al. | 501/97 |
| 4,623,400 | 11/1986 | Japka et al. | 148/6.35 |
| 4,786,526 | 11/1988 | Arai et al. | 427/249 |
| 4,844,949 | 7/1989 | Arai et al. | 427/213 |
| 4,892,759 | 1/1990 | Arai et al. | 427/249 |
| 4,956,204 | 9/1990 | Amazawa et al. | 427/248.1 |

FOREIGN PATENT DOCUMENTS

| | | |
|---|---|---|
| 0068950 | 6/1982 | European Pat. Off. |
| 0214489 | 8/1986 | European Pat. Off. |
| 2309648 | 4/1975 | France |

OTHER PUBLICATIONS

Stinton, David P., et al., "Advanced Ceramics by Chemical Vapor Deposition Techniques", *Ceramic Bulletin*, vol. 67, No. 2, 1988, pp. 350–355.

Jennings, H. M., "On Reactions Between Silicon and Nitrogen, Part 1: Mechanisms", *Journal of Materials Science*, vol. 18, 1963, pp. 951–967.

Mazdiyasni, K. S., et al., "Synthesis, Characterization, and Consolidation of $Si_3N_4$ Obtained from Ammonolysis of $SiCl_4$", *Journal of the American Ceramic Society*, vol. 56, No. 12, 1973, pp. 628–633.

Pugar, Eloise A., et al., "Low Temperature Direct Reactions Between Elemental Silicon and Liquid Ammonia or Amines for Ceramics and Chemical Intermediates", *Material Research Society Symposium Proceedings*, vol. 121, 1988, pp. 439–447.

Patent Abstracts of Japan, vol. 11268, Publication No. 62-070529, Aug. 29, 1987.

Patent Abstracts of Japan, vol. 12191, Publication No. 62-294175, Jun. 3, 1988.

Patent Abstracts of Japan, vol. 13255, Publication No. 01-056872, Jun. 13, 1989.

Wilfing et al., "Fourth European Conference Chem. Vapor Deposition May 31–Jun. 2, 1983", (Abstract only).

*Primary Examiner*—Shrive Beck
*Assistant Examiner*—Katherine A. Bareford
*Attorney, Agent, or Firm*—John Taylor

[57] ABSTRACT

A process is described for coating a substrate surface in a heated fluidized bed reactor which comprises flowing one or more coating source materials in a condensed state into a fluidized bed reactor which is maintained at a temperature which is higher than the decomposition and/or reaction temperature of the one or more coating source materials but lower than the vaporization temperature of the coating composition formed in the reactor, whereby the coating composition formed by such decomposition and/or reaction will form a coating film on the substrate surface.

28 Claims, 1 Drawing Sheet

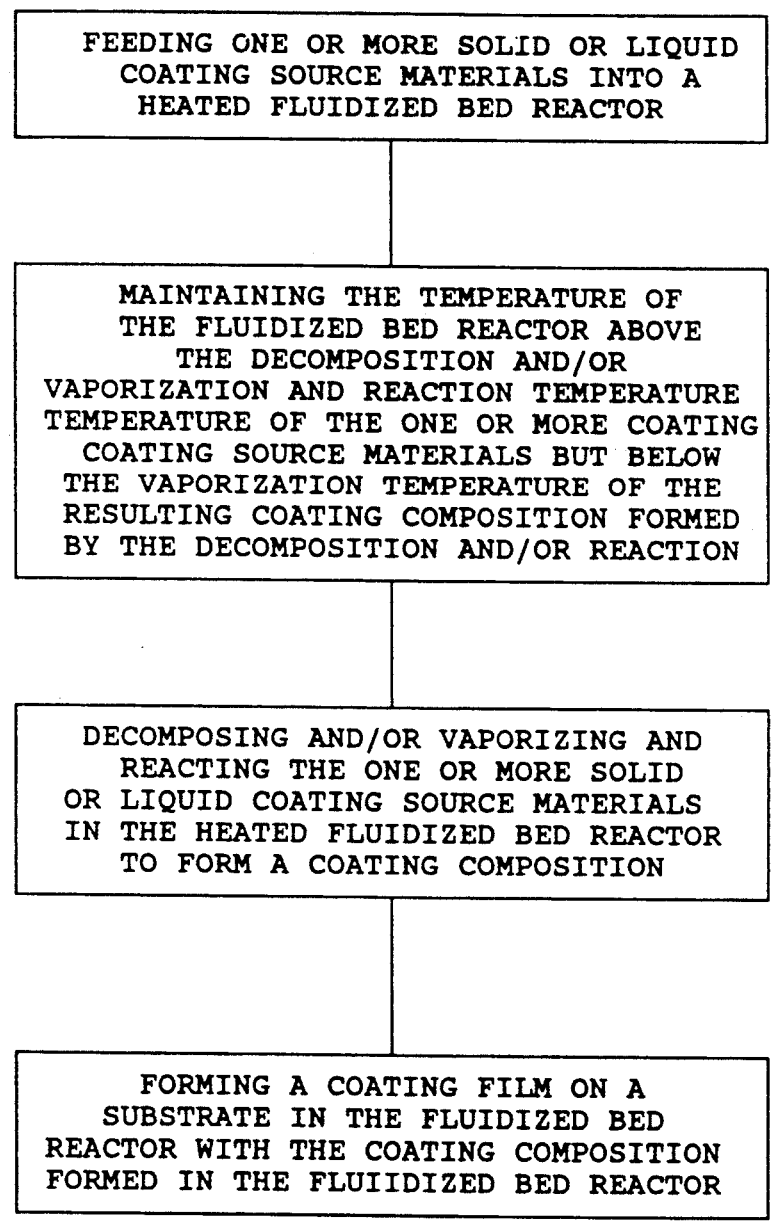

METHOD OF COATING A SUBSTRATE

BACKGROUND OF THE INVENTION

1. Field of the Invention

This invention relates to a method of coating a substrate in a fluidized bed. More particularly, this invention relates to a method of coating a substrate which may have a high surface area in a fluidized bed using coating source material which is fed into the bed in condensed form.

2. Description of the Related Art

Processes to form films on substrates, e.g., chemical vapor deposition (CVD) processes, conventionally transport the coating source material to the reactor containing the substrate to be coated in a gaseous or vapor, i.e., noncondensed, state comprising one or more of the following constituents: (a) a precursor for the material to be deposited; (b) reducing, oxidizing, or otherwise reacting gases; and (c) inert carrier gases used for chemical transport and/or heat and mass transfer. As these materials enter the reactor, which is kept at a high temperature, reactions occur and products are formed which deposit on the substrate surface.

While the different components of the coating system are conventionally all introduced into the coating reactor as gases or vapors, if the components are solids or liquids at room temperature, they must first be vaporized and then transported into the reactor as vapors. To control the rate of feed to the reactor, the vapor pressure and the flow rate have to be carefully controlled.

Such careful control of vapor pressure, in turn requires vaporizers with sophisticated thermal controls, and heated feed lines from the vaporizers to the reactor. Typically thermal baths are used to maintain the temperature of the vaporizer within a fraction of a degree. In addition, calibration runs are needed, because the saturation of the carrier gas and the control of flow are also sources of error. When very precise compositions are required, the control equipment and the need for constant calibrations result in low productivity, low reliability, and high equipment and production costs.

When relatively unstable molecules, such as organometallics, are used as coating precursors, a further limitation occurs. Many of these molecules start vaporizing and decomposing or polymerizing within a narrow temperature range. To avoid decomposition or polymerization in the evaporator, the temperature is kept as low as possible, but this results in a very low vapor pressure which, in turn, results in very low deposition rates.

In any of these coating systems, the use of coating source materials in gaseous or vapor (non-condensed) form is particularly troublesome when attempting to coat high surface area materials, e.g., very small particles, because of the difficulty of feeding large quantities of coating source material into the reactor in the gaseous or vapor state.

It would, however, be advantageous to provide an economical film forming process that could avoid or minimize the need for sophisticated, expensive, and difficult to maintain evaporators, and the limitations in operating conditions attendant with the use of such evaporators; and which would be capable of quickly and thoroughly coating large and/or complex surface area objects.

SUMMARY OF THE INVENTION

The invention comprises a process for coating a substrate surface in a heated fluidized bed reactor which comprises introducing one or more coating source materials in a condensed state into a fluidized bed reactor which is maintained at a temperature which is higher than the decomposition, and/or vaporization and reaction, temperature of the one or more coating source materials in a condensed state, but lower than the vaporization temperature of the coating composition formed in the reactor by the decomposition and/or reaction of the one or more coating source materials, whereby the decomposition and/or reaction of the one or more coating source materials to form a coating composition will form a coating film on the substrate surface.

BRIEF DESCRIPTION OF THE DRAWINGS

The sole drawing is a flowsheet illustrating the process of the invention.

DETAILED DESCRIPTION OF THE INVENTION

The invention comprises a process for coating a substrate surface in a heated fluidized bed reactor with a coating composition formed from the decomposition and/or vaporization and reaction of one or more coating source materials introduced in condensed state into a heated fluidized bed reactor.

The fluidized bed is maintained at a temperature higher than the decomposition and/or vaporization and reaction temperature of the one or more coating source materials, but lower than the vaporization temperature of the resulting coating composition formed in the reactor. The coating composition formed in situ in the reactor from the decomposition and/or vaporization and reaction of the coating source material(s) will then form a coating film on the substrate surface.

In the process of the invention, the fluidized bed particles are not reactants, but serve to heat and vaporize the incoming liquid or solid coating source materials and, in a preferred embodiment, also act as the substrate to be coated by the coating composition formed in situ in the fluidized bed.

In a related case filed by one of us, Sanjurjo U.S. Pat. application Ser. No. 07/654,395, filed Feb. 8, 1991, as a continuation of Ser. No. 07/333,180, filed on Apr. 4, 1989, both assigned to the assignee of this application, and cross-reference to which is hereby made, there is described the formation of powders or coatings in a fluidized bed by reaction between metal reactants in particulate form in the bed and gaseous halogen-containing reactants to form a metal powder or a metal coating on a substrate or an intermediate reaction product which then reacts with a third reactant in a second zone in the bed to form either a powder of a metal compound or a metal compound coating on a substrate.

I. The Fluidized Bed/Substrate

The fluidized bed used in the process of this invention, which does not comprise one of the reactants, may be maintained in any conventional fluidized bed reactor capable of being maintained within the desired operating temperature range. The apparatus may be continuous or batch type apparatus, although the use of a batch type apparatus may be preferred to ensure uniform coating film thickness on all of the fluidized bed particles.

The particles making up the fluidized bed may comprise any type of material which is (a) chemically inert to reaction with the coating source materials, decomposition product(s), and/or coating composition formed therefrom in the reactor (i.e., the fluidized bed particle material is not a reactant); and (b) of any size and density which will permit the particles to be fluidized under the pressure, flow rate, or any other fluidizing conditions employed in the reactor, as will be discussed below.

In the preferred embodiment, wherein the fluidized bed particles comprise the substrate surface to be coated with the coating material, which will be formed in the reactor by the decomposition and/or reaction of the one or more coating source material to be fed into the reactor, the fluidized bed particles must further comprise a material capable of being so coated.

The fluidized bed particles may be solid (nonporous) or may comprise a low density porous materials, for example, having a density as low as 0.2 gram/cm$^3$ and a surface area as high as 1000 m$^2$/gram. Most preferably, the fluidized bed particles range in size from about 1-2 microns up to about 2000 microns, although larger size particles may be used provided that they are capable of being fluidized in the reactor under the fluidizing conditions employed, as will be discussed below.

Examples of materials which may comprise the fluidized bed particles to be coated in the bed include glass spheres, including micro glass spheres having a particle size ranging from about 20 to about 30 microns; mica flakes ranging in size (longest dimension) from about 1 to about 30 microns; and nickel and copper particles, including nickel and copper particles having a particle size ranging from about 1 to about 50 microns. Examples of other materials which may comprise the fluidized particles capable of being coated, in accordance with the process of the invention, include alumina, titania, silica, iron, chromia, barium titanate (BaTiO$_3$) and other piezo-electric materials, and ferrites.

In the preferred embodiment, the fluidized bed particles function both as a substrate to be coated by the coating material to be formed in situ in the fluidized bed, and as a heat source to quickly heat the coating source material so that it will decompose, react, or decompose and react to form the desired coating film on the fluidized bed particle surface. The fluidized bed particle may also act as a catalytic substrate or surface to promote the decomposition and/or reaction of the coating source material(s) in the bed. However, it should again be emphasized that the fluidized bed material does not act as a reactant in any chemical reactions taking place in the bed.

While the particles comprising the fluidized bed preferably also comprise the substrate on which the coating film will deposit, it is within the scope of the invention to also mount or suspend in the fluidized bed another substrate (i.e., a substrate not in particulate form) to be coated by the coating composition being formed in situ in the reactor. In such an instance, the fluidized particles merely act as a heating medium and may possibly comprise a material to which the coating composition will not adhere, e.g., teflon balls.

The fluidizing medium used to fluidize the bed may comprise any gaseous medium which is inert to or non-reactive with the coating source material being fed into the reactor in condensed form. Preferably, the gaseous fluidizing medium is also non-reactive with the decomposition product or products or reaction product formed in the reactor from the coating source material. Other fluidizing means may also be employed such as, for example, vibratory means, magnetic means, ultrasonic means, etc.

Examples of fluidizing gases which will be non-reactive with virtually all of the coating source materials or decomposition and/or reaction products formed therefrom include inert gases such as argon, neon, and helium. In some cases, other gases such as nitrogen, hydrogen, and even oxygen may be used provided that the gases are inert to the particular reactions and materials being used or formed, except as will be discussed below.

II. Physical Parameters of Fluidized Bed

The flow rate of the fluidizing gas flowing through the bed may vary, depending upon the density, size and shape of the particle, as well as the temperature and pressure of the gas. Usually a linear flow rate of from about 5 to about 10 centimeters/second will be employed.

The height of the fluidized bed may vary considerably, but must be sufficiently high, with respect to the flow rate through the reactor, to permit the necessary minimum residence time of the at least one liquid or solid coating source material to vaporize and decompose and/or react to form the desired coating composition on the substrate. Typically, the decomposition and/or vaporization and reaction will occur within a 10 cm. bed height.

The fluidized bed may be heated by any conventional means such as preheating the fluidizing gas before it enters the fluidized bed reactor or by internal heating coils within the reactor, external heating coils around the outside of the reactor walls, or by electromagnetic means such as rf, microwave, etc.

With the exception of the case wherein a single coating source material decomposes to directly form the desired coating composition, the temperature within the reactor is maintained sufficiently high to vaporize the incoming solid or liquid coating source material, and to permit formation of the coating composition by decomposition and/or reaction of the vaporized coating source material to form the desired coating composition which will coat the substrate in the reactor.

It should be noted that in some instances wherein a reaction takes place to form the coating composition and the reaction is exothermic, the actual reaction temperature will be higher than the bed temperature, but even in such instances the bed temperature must be sufficiently high to permit initiation of the exothermic reaction.

However, the temperature within the fluidized bed must be lower than the melting point, sublimation temperature, or decomposition temperature of the resulting coating composition which is formed in situ in the fluidized bed and which forms a coating film on the substrate in the reactor.

The pressure within the fluidized bed reactor will advantageously be only slightly above ambient to permit sufficient fluidization of the bed by the incoming gas pressure. However, pressures ranging from as little as 1 Torr to as much as 1500 Torr, preferably from about 100 Torr to about 1100 Torr, and most preferably from about 700 Torr to about 800 Torr, may be utilized in the reactor.

III. Coating Source Material

The coating source material or materials to be introduced into the fluidized bed in condensed form may comprise any compound or material, whether metallic, nonmetallic, organic or inorganic which, usually after vaporizing, will form a coating material in the fluidized bed reactor by decomposition, reaction with another coating source material, or a combination of both decomposition and reaction. For example, any chemical vapor deposition (CVD) sources, such as organometallics and volatile metal halides, may be employed.

While as stated above, the coating source material should be introduced into the fluidized bed reactor in condensed form, in one embodiment, where two or more coating source materials are introduced into the fluidized bed reactor, one or more of these coating source materials may be in a gaseous state, provided, however, that at least one other of the coating source materials is in a condensed state.

For example, ammonia gas may comprise a gaseous coating source material when liquid titanium tetrachloride ($TiCl_4$) is introduced into the fluidized bed reactor to react together to form a titanium nitride coating composition. Also, by way of example, oxygen gas may be used as a coating source material to oxidize a metal coating composition formed by decomposition of a coating source material introduced into the fluidized bed in a condensed state, e.g., an organoaluminum compound which decomposes to form aluminum which is then oxidized to form an alumina coating composition. Other gaseous coating source materials which may be used in combination with coating source materials in a condensed state include hydrogen; alkanes such as methane, ethane, propanes, and butanes; boranes; hydrogen sulfide; and nitrogen.

In some instances, where such a gaseous coating source materials is used, it may be desirable to conduct the process in a sequential manner in which the one or more coating source materials in condensed form are introduced into the reactor to form a coating precursor and then the flow of the gaseous coating source material is commenced to, for example, oxidize the coating precursor already formed as a coating film on the substrate. This sequential addition may be repeated one or more times to provide a cyclic or pulsating process.

Even in such situations, however, the process of the invention is characterized from the prior art in that the coating source material which is difficult to transport in a vaporized state to the fluidized bed reactor, e.g., an organometallic coating source material, is transported to and introduced into the fluidized bed in a condensed state. However, it must be emphasized, that in the preferred embodiment of the process of the invention, all of the coating source materials will be introduced into the fluidized bed reactor in a condensed state.

By use of the term "decomposition" is meant any change in the state of an element, compound or material, including disproportionation, or a change which results in the formation of a coating material; or which results in the formation of a decomposition product which is a reactant capable of reacting with another coating source material or decomposition product thereof to form a coating material.

The expression "chemical reaction", as used herein, is intended to define a reaction between a decomposition product of a coating source material and another coating source material reactant; a reaction between two coating source material reactants; or a reaction between decomposition products of two different coating source materials (as opposed to the decomposition or disproportionation of a single coating source material).

The coating source material is fed into the fluidized bed reactor in condensed form, either as a solid or a liquid. When the coating source material is in the form of a solid, it is preferably in particulate form to provide a large surface contact area whereby the solid coating source material may be quickly heated and thereby volatilized and/or decomposed. When in particulate form, the particles may comprise any size which will permit them to intersperse with the fluidized bed particles to thereby provide a homogeneous concentration of the volatilizing or decomposing coating source material throughout the bed.

While there is no limit on the particle size of the coating source material, except as stated above, in practicality, the size of the particles will rarely exceed about $\frac{1}{4}''$ in diameter to avoid the use of excessive pressures or flow rates of fluidizing gas passing through the bed.

When introduced into the reactor in liquid form, the coating source material may be introduced as a stream, as droplets, or as a spray or aerosol. It is also possible to impregnate the liquid coating source material into a porous particle which may comprise either a second coating source material or a non-reactive fluidized bed particle, and then fed this impregnated particle into the fluidized bed. When the coating source material is to be introduced into the fluidized bed as a liquid, it may comprise a molten solid material or a solid material which has been dissolved in an appropriate solvent. Such solvents may also comprise coating source materials or may merely volatilize in the reactor and be carried off by the flow of fluidizing gases.

Whether introduced into the reactor in either solid or liquid form, the coating source material may be introduced into the top, side, or bottom of the fluidized bed reactor, but is preferably introduced through the top of the reactor.

In the preferred embodiment, the coating source material must be capable of being transported to the reactor in a solid or liquid state, and (except for the special case where a single coating source material decomposes to directly form the desired coating material without vaporizing) must be capable of being converted into a gaseous state, upon being introduced into the fluidized bed reactor and heated to the minimum temperature of the fluidized bed as discussed above. This includes (a) the case of a solid or liquid coating source material which is vaporized in the bed to form a reactant which will then react with another vaporized coating source material reactant in the fluidized bed to form the desired coating composition; (b) a coating source material which decomposes or disproportionates into a vaporized reactant which reacts with another vaporized coating source material reactant to form the desired coating composition; or (c) a coating source material which decomposes or disproportionates into a vaporized reactant which reacts with another vaporized reactant formed by the decomposition or disproportionation of another coating source material.

The following equations will be helpful in illustrating the various cases wherein the coating material will respectfully comprise: (1) a solid decomposition product from a single coating source material (i.e., the decomposition product is the desired coating material); (2) a reaction product of first and second coating source material reactants; (3) a reaction product of a decomposition product of a first coating source material and another reactant comprising a second coating source material; and (4) a reaction product of two decomposition products respectively from first and second coating source materials introduced into the fluidized bed and decomposed.

What, however, is common in all cases shown in the following equations is that each coating source material (the material or compound on the left side of the equation) is introduced into the fluidized reactor in a condensed form; each coating source material vaporizes or decomposes at the temperature of the fluidized bed; and a new coating material is formed which is not in a vaporized state at the temperature of the fluidized bed. As will also be seen in some of the equations below, a further requirement, in those cases where there will be other reaction products, is that any such other reaction products or by products be in a vapor state so that they will not interfere with the desired coating of the particles. Such other reaction products, which should be in a vaporizable state, are shown in the equations below followed by a vertical arrow which indicates that such reactant or reaction product is not the desired coating material, but is in gaseous form and will be removed from the bed in the flow of fluidizing gases.

DECOMPOSITION ONLY

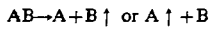  (1)

REACTION ONLY

  (2)

DECOMPOSITION AND REACTION

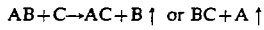  (3) or

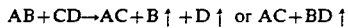  (4a) or

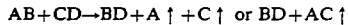  (4b)

Examples of decomposable coating source materials which fit into the equation 1 category include organometallic compounds such as trisobutyaluminum, which decomposes at about 300° C. to form an aluminum coating material which has a melting point of about 660° C.; nickel "resinate" which decomposes at about 600° C. to form a nickel coating which has a melting point of 1455° C.; and nickel acetyl acetonate which decomposes below about 500° C. to also form a nickel coating material.

Other examples of decomposable organic coating source materials fitting into the equation 1 category include lanthanum hexafluoro acetyl acetonate, which decomposes at about 600° C. to form lanthanum fluoride, which has a melting point of about 1400° C.; diethyl gallium azide, which decomposes at 350°–450° C. to form gallium nitride, which sublimes at about 800° C.; aluminum acetyl acetonate, which decomposes at about 550° C. to form alumina (M.P. 2050° C.); and zirconium $\beta$-diketonate, which decomposes at about 400° C. to form zirconia (M.P. ~2700° C.).

Inorganic coating source materials fitting into the equation 1 category which decompose to form a coating compound include: nickel nitrate ($Ni(NO_3)_2$), which decomposes at 260° C. to form a nickel oxide coating composition which has a melting temperature of 1984° C.; borazine ($B_3N_3H_3$), which decomposes at about 1000° C. to form BN, a coating composition which has a sublimation temperature of about 3000° C.; and tribromosilane which decomposes at about 900° C. to form a silicon coating composition which has a melting temperature of about 1410° C.

An example of a mixture of reactant coating source materials which fit into the equation 2 category is a liquid mixture of titanium tetrachloride and water coating source materials, which react with one another at 600° C. to form a titanium oxide coating composition which melts at 1750° C.

An example of a mixture of coating source materials, one of which decomposes into one or more decomposition products, which will react with the other coating source material in the mixture fed into the fluidized bed, as in equation 3 above, is a mixture of triisobutyl aluminum and sulfur, wherein the triisobutyl aluminum decomposes at 300° C. to provide aluminum as a decomposition product/reactant which then reacts with the sulfur reactant at this temperature, to form an aluminum sulfide coating composition with a melting point of 1100° C.

An example of a mixture of coating source materials, each of which decompose into one or more decomposition products, which will react with each other when the coating source materials are decomposed in the fluidized bed, as in equations 4a or 4b above, include a mixture of trimethyl antimony and trimethyl gallium which both respectively vaporize at about 25° C. and decompose at about 600° C. to respectively form antimony and gallium, which react with one another to form gallium antimonide, having a melting point of about 900° C.

The following examples will serve to further illustrate the process of the invention.

Example I

A 0.5 liter fluidized bed of micro glass spheres, having an average diameter ranging from 20 to 30 microns, and an average depth of about 8 cm., was formed in a fluidized bed reactor by passing argon gas through the reactor at a linear flow rate of 1 cm./sec (60 cc/sec flow). The bed was maintained at an average temperature of at least about 300° C., but less than 450° C. by heating the reactor walls with an external heater. Liquid triisobutyl-aluminum was injected dropwise into the top of the fluidized bed at a rate of 0.01 cc/sec where it decomposed to form an aluminum coating on the glass spheres. After about 20 minutes, the flow of triisobutyl-aluminum was stopped, the heater was shut off, and the flow of fluidizing gas was then shut off after the reactor had cooled to room temperature. The coated glass spheres were removed from the reactor and examined. The previously white in appearance glass spheres were found to have a silvery gray appearance, indicating the presence of a deposited aluminum coating thereon.

The process was repeated using 1–30 micron in length mica flakes, and <10 micron nickel particles, resulting in the formation, in each case, of a uniform aluminum coating on the mica flake or nickel particle substrate. When a flow of either oxygen or water vapor was subsequently flowed through the reactor at a flow rate of about 100 cc/min, a coating of aluminum oxide ($Al_2O_3$) was formed on the surface of the respective substrates. In both the cases of the aluminum-coated mica flakes and the aluminum-coated nickel particles, the coating was examined by Auger electron spectroscopy, optical microscopy, and scanning electron microscopy (SEM) and found to be satisfactory.

Example II

A 0.5 liter fluidized bed of graphite particles having an average particle size of about ~30 microns, and an average bed depth of about 5 cm., was formed in a fluidized bed reactor by passing a fluidizing gas mixture of 90 vol. % argon/10 vol % hydrogen gas through the reactor at a linear flow rate of 5–8 cm./sec. The bed was maintained at an average temperature of at least 600° C., but less than 700° C. by rf heating. Nickel acetyl acetonate was premixed with the graphite particles before the particles were loaded into the bed, fluidized, and heated. The nickel acetyl acetonate decomposed in the fluidized bed to form a nickel/nickel oxide coating on the graphite particles. After 30 minutes, the heater was shut off, and the flow of fluidizing gas was then subsequently shut off after the reactor cooled to room temperature. The coated graphite particles were removed from the reactor and visually examined. The particles were found to be coated with a silvery gray nickel/nickel oxide mixture. By substituting an aqueous solution of a mixture of nickel chloride and nickel nitrate ($Ni(NO_3)_2$) for the nickel acetyl acetonate, a coating of nickel oxide was formed on the graphite particles.

Example III

A coating of a $YBa_2Cu_3O_7$ superconductor on a silver substrate can be formed by thoroughly mixing together 1 mole of yttrium $\beta$-diketonate powder, 2 moles of barium $\beta$-diketonate powder, and 3 moles of copper $\beta$-diketonate and feeding the powder mixture into a fluidized bed reactor containing 1–100 micron diameter silver particles maintained at a temperature of at least about 600° C., but less than about 900° C., while flowing a fluidizing gas such as argon through the fluidized bed. The fluidized silver particles will comprise the substrate on which the $YBa_2Cu_3O_7$ superconductor will form. Preferably, oxygen, at a partial pressure of from about 0.1 to about 0.3 atmospheres, and $NO_2$, at a partial pressure of from about 0.1 to about 0.05 atmospheres, can be added to the fluidizing gas during the reaction for superior results.

Thus, the invention comprises an improved method for forming a coating film on a substrate in a fluidized bed formed from one or more coating source materials transported to and introduced into a heated fluidized bed reactor wherein the coating source materials are vaporized and decompose and/or react to form a coating material which will form a solid coating film on the substrate at the temperature maintained in the fluidized bed reactor.

Having thus described the invention what is claimed is:

1. A process for coating the surface of a substrate in a heated fluidized bed reactor which comprises:
   a) introducing into a fluidized bed reactor two or more coating source materials in a condensed state capable of either decomposing into vaporized reactants or vaporizing to form said vaporized reactants;
   b) maintaining the fluidized bed particles in said fluidized bed reactor at a temperature which is:
      i) higher than the decomposition and/or vaporization temperatures of said two or more coating source materials and also higher than the reaction temperatures of said decomposed and/or vaporized two or more coating source materials; and
      ii) lower than the vaporization temperature of the coating composition formed in said reactor by reaction together of said decomposed and/or vaporized coating source materials;
   c) reacting said two or more decomposed and/or vaporized coating source materials together in said fluidized bed to form said coating composition; and
   d) forming a coating film of said coating composition on said substrate surface.

2. The process of claim 1 wherein a third coating source material is introduced into said fluidized bed reactor in a gaseous state.

3. The process of claim 2 wherein said one of said two or more coating source materials introduced into said fluidized bed reactor in a condensed state, comprises a coating source material which decomposes in said fluidized bed reactor to form a reactant which may react in said fluidized bed reactor with said one or more other of said two or more coating source materials introduced into said reactor in a condensed state, and with said coating source material, introduced into said reactor in a gaseous state, to form said coating composition.

4. The process of claim 2 wherein said coating source material, introduced into said fluidized bed reactor in a gaseous state, is introduced into said fluidized bed after introduction of said two or more coating source materials in a condensed state.

5. The process of claim 2 wherein said gaseous state coating source material is selected from the group consisting of ammonia, oxygen, hydrogen, alkanes, boranes, hydrogen sulfide, and nitrogen.

6. The process of claim 1 wherein said two or more coating source materials are introduced into said fluidized bed reactor cyclically more than one time.

7. The process of claim 1 wherein two or more coating source materials, each introduced into said fluidized bed reactor in a condensed state, each decompose in said fluidized bed reactor to form a decomposition product reactant, and said reactants then react with one another in said fluidized bed reactor to form said coating composition.

8. The process of claim 7 wherein at least one of said decomposition product reactants which react together to form said coating composition is in a vaporized state at the time of reaction.

9. The process of claim 7 wherein another coating source material is introduced into said fluidized bed reactor in a gaseous state.

10. The process of claim 1 wherein one of said two or more coating source materials, introduced into said fluidized reactor in a condensed state, decomposes in said fluidized bed reactor to form a decomposition product reactant which then reacts in said fluidized bed reactor with said one or more other coating source materials.

11. The process of claim 10 wherein at least one of said reactants which react together in said fluidized bed reactor to form said coating composition is in a vaporized state at the time of reaction.

12. The process of claim 10 wherein a third coating source material is introduced into said fluidized bed reactor in a gaseous state.

13. The process of claim 1 wherein said two or more coating source materials, each introduced into said fluidized bed reactor in a condensed state, react with one another in said fluidized bed reactor without first decomposing to form said coating composition.

14. The process of claim 13 wherein at least one of said reactants which react together to form said coating composition is in a vaporized state at the time of reaction.

15. The process of claim 13 wherein a third coating source material is introduced into said fluidized bed reactor in a gaseous state.

16. A process for coating the surface of a substrate in a heated fluidized bed reactor which comprises:
   a) flowing a single decomposable coating source material in condensed state into a fluidized bed reactor;
   b) maintaining the fluidized bed particles in said fluidized bed reactor at a temperature which is:
      i) higher than the decomposition temperature of said single coating source material; and
      ii) lower than the vaporization temperature of the decomposition produce of said single decomposable coating source material comprising a coating composition formed in said reactor;
   c) decomposing said single decomposable coating source in said fluidized bed to thereby form said coating composition in said fluidized bed without reaction of said decomposition product with any other reactant; and
   d) forming a coating film of said coating composition comprising said decomposition product on said substrate surface.

17. The process of claim 16 wherein said single coating source material, introduced into said fluidized bed reactor in a condensed state, vaporizes in said fluidized bed reactor and then decomposes to form said coating composition.

18. The process of claim 16 wherein said single coating source material, introduced into said fluidized bed reactor in a condensed state, directly decomposes in said fluidized bed reactor, without first vaporizing, to form said coating composition.

19. The process of claim 16 wherein said single coating source material which decomposes in said fluidized bed to form said coating composition comprises an organo-metallic compound.

20. The process of claim 16 wherein said single coating source material which decomposes in said fluidized bed to form said coating composition is selected from the group consisting of triisobutyl aluminum, nickel resinate, nickel acetyl acetonate, lanthanum hexafluoro acetyl acetonate, diethyl gallium azide, aluminum acetyl acetonate, zirconium $\beta$-diketonate, nickel nitrate, borazine, and tribromosilane.

21. The process of claim 20 wherein said single coating source material which decomposes in said fluidized bed to form said coating composition is nickel acetyl acetonate.

22. The process of claim 20 wherein said single coating source material which decomposes in said fluidized bed to form said coating composition is triisobutyl aluminum.

23. A process for coating the surface of a substrate in a heated fluidized bed reactor which comprises:
   a) introducing yttrium $\beta$-diketonate, barium $\beta$-diketonate, and copper $\beta$-diketonate as coating source materials in a condensed state into a fluidized bed reactor;
   b) maintaining the fluidized bed particles in said fluidized bed reactor at a temperature which is:
      i) higher than the reaction temperature of said coating source materials; and
      ii) lower than the vaporization temperature of the coating composition formed in said reactor by reaction of said coating source materials;
   c) reacting said coating source materials together in said fluidized bed reactor to form a $YBa_2Cu_3O_7$ coating film on said substrate surface.

24. The process of claim 23 wherein one or more oxygen-containing gases is introduced into said fluidized bed reactor during said reaction.

25. A process for coating the surface of a substrate in a heated fluidized bed reactor which comprises:
   a) introducing at least two decomposable coating source materials, each in a condensed state, into a fluidized bed reactor;
   b) maintaining the fluidized bed particles in said fluidized bed reactor at a temperature which is:
      i) at least as high as:
         (1) the decomposition temperature at which both of said decomposable coating source materials decompose to form decomposition products; and
         (2) the reaction temperature at which said decomposition products will react to form said coating composition; and
      ii) lower than the vaporization temperature of said coating composition formed by said reaction of said decomposition products formed in said reactor by said decomposition of said two or more coating source materials;
   c) reacting together in said fluidized bed said two or more decomposition products of said two or more coating source materials to form said coating composition; and
   d) forming on said substrate surface a coating film of said coating composition reaction product of said at least two decomposition products of said two or more coating source materials.

26. A process for coating the surface of a substrate in a heated fluidized bed reactor which comprises:
   a) introducing into a fluidized bed reactor two or more coating source materials each in a condensed state which are capable of vaporizing in said fluidized bed reactor and then reacting with one another to form a coating composition reaction product;
   b) maintaining the fluidized bed particles in said fluidized bed reactor at a temperature which is:
      i) higher than the vaporization temperature of all of said coating source materials and at least as high as the reaction temperature at which said two or more coating source materials in vaporized form will react to form said coating composition reaction product; and
      ii) lower than the vaporization temperature of said coating composition reaction product formed in said reactor by said reaction between said two or more vaporized coating source materials;
   c) reacting together in said fluidized bed said two or more vaporized coating source materials to form said coating composition; and
   d) forming on said substrate surface in said fluidized bed reactor, a coating film of said coating composition reaction product formed in said fluidized bed reactor.

27. A process for coating the surface of a substrate in a heated fluidized bed reactor which comprises:
a) introducing into a fluidized bed reactor in a condensed state;
  i) at least one decomposable coating source material capable of decomposing to form at least one decomposition product reactant; and
  ii) at least one reactant coating source material capable of vaporizing, if not already in gaseous phase, and then reacting in vaporous form with said at least one decomposition product reactant to form a coating composition reaction product;
b) maintaining the fluidized bed particles in said fluidized bed reactor at a temperature which is:
  i) at least as high as:
    (1) the decomposition temperature of said at least one decomposable coating source material;
    (2) the vaporization temperature of said other coating source material; and
    (3) the reaction temperature at which said at least one decomposition product will react with said at least one reactant coating source material in vaporous form to form said coating composition; and
  ii) lower than the vaporization temperature of said coating composition formed by said reaction of said at least one reactant coating source material with said at least one decomposition product;
c) reacting together in said fluidized bed said at least one decomposition product reactant and said at least one coating source material in vaporous form to form said coating composition; and
d) forming on said substrate surface a coating film of said coating composition.

28. A process for coating the surface of a substrate in a heated fluidized bed reactor which comprises:
a) introducing triisobutyl aluminum in a condensed state as a coating source material into a fluidized bed reactor;
b) maintaining the fluidized bed particles in said fluidized bed reactor at a temperature which is:
  i) higher than the decomposition temperature of said triisobutyl aluminum coating source material; and
  ii) lower than the vaporization temperature of the aluminum coating composition formed in said reactor by said decomposition;
to form an aluminum coating composition; and
c) treating said aluminum coating composition with a coating source material selected from the group consisting of oxygen and water vapor to form an aluminum oxide coating film on said substrate on said substrate surface.

* * * * *